United States Patent
Thomas et al.

(10) Patent No.: US 7,916,057 B2
(45) Date of Patent: Mar. 29, 2011

(54) COMPLEX-ADMITTANCE DIGITAL-TO-ANALOG CONVERTER

(75) Inventors: Andrew Joseph Thomas, Arlington, MA (US); Joseph Luis Sousa, Lawrence, MA (US)

(73) Assignee: Linear Technology Corporation, Milpitas, CA (US)

(*) Notice: Subject to any disclaimer, the term of this patent is extended or adjusted under 35 U.S.C. 154(b) by 89 days.

(21) Appl. No.: 12/430,482

(22) Filed: Apr. 27, 2009

(65) Prior Publication Data
US 2010/0271245 A1 Oct. 28, 2010

(51) Int. Cl.
*H03M 1/66* (2006.01)
(52) U.S. Cl. .......... 341/144; 341/150; 341/172
(58) Field of Classification Search ............ 341/150, 341/144, 172
See application file for complete search history.

(56) References Cited

U.S. PATENT DOCUMENTS

| | | | |
|---|---|---|---|
| 4,751,497 A | 6/1988 | Torii | |
| 4,958,155 A | 9/1990 | Gulczynski | |
| 5,581,252 A * | 12/1996 | Thomas | 341/144 |
| 5,889,486 A * | 3/1999 | Opris et al. | 341/150 |
| 6,714,151 B2 * | 3/2004 | Tachibana et al. | 341/155 |
| 7,034,737 B1 * | 4/2006 | Huang | 341/172 |
| 2005/0200510 A1 | 9/2005 | Yoshida et al. | |
| 2006/0092065 A1 | 5/2006 | Pan | |
| 2007/0115159 A1 * | 5/2007 | Tachibana et al. | 341/144 |
| 2007/0132626 A1 | 6/2007 | Hurrell | |

OTHER PUBLICATIONS

European Search Report issued in European Patent Application No. 10004454.4-2206, mailed Jun. 28, 2010.
B. P. Ginsburg et al., "An Energy-Efficient Charge Recycling Approach for a SAR Converter with Capacitive DAC," IEEE Symp. Circuits & Systems, vol. 1, pp. 184-187, Mar. 2005.
J. L. McCreary et al., "All-MOS Charge Redistribution Analog-to-Digital Conversion Techniques—Part I," IEEE J. Solid-State Circuits, vol. SC-10, pp. 371-379, Dec. 1975.

* cited by examiner

*Primary Examiner* — Jean B Jeanglaude
(74) *Attorney, Agent, or Firm* — McDermott Will & Emery LLP

(57) ABSTRACT

A circuit includes a digital-to-analog converter configured to produce an analog output signal (1) proportional to a reference signal and (2) as a function of a digital input signal. The converter comprises a plurality of non-trivially complex admittances configured so that each non-trivially complex admittance can be selectively switched as a function of the digital input signal so as to be coupled between a reference terminal configured to receive a reference signal and an output terminal. The method comprises selectively switching non-trivially complex admittances as a function of the digital signal between a reference terminal and an output terminal.

45 Claims, 6 Drawing Sheets

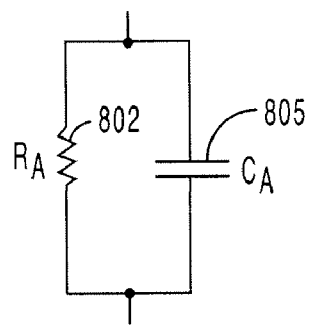
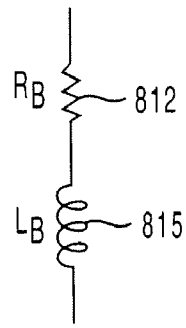
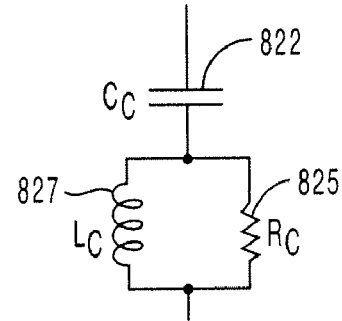
FIG. 5A        FIG. 5B        FIG. 5C
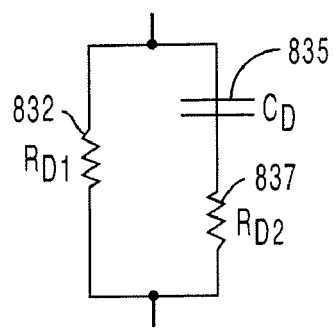
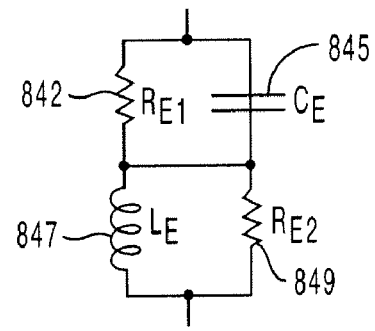
FIG. 5D        FIG. 5E

COMPLEX-ADMITTANCE DIGITAL-TO-ANALOG CONVERTER

RELATED APPLICATIONS

None

FIELD OF THE DISCLOSURE

The present disclosure relates to digital-to-analog converters (DACs), and more specifically to DACs comprising non-trivially-complex admittance elements.

BACKGROUND

The function of a DAC is to produce an analog output variable $a_{out}$ (for example current or voltage), which is related to a digital input signal $d_k$ (where k ranges from 0 to n−1, and each $d_k$ usually is a bit representing a binary state of 0 or 1) by some set of bit weights $u_k$ and a reference quantity R. Specifically, $$a_{out} = R \sum_{k=0}^{n-1} w_k d_k \quad (1)$$

Many codings are known, including binary:

$$w_k = 2^{k-\alpha}, \text{ or } w_k = \frac{1}{n}$$

Two architectures which implement this function are the voltage-switched resistor DAC and the charge-scaling DAC.

As illustrated in FIG. 1, a voltage-switched resistor DAC includes a collection of accuracy-determining resistors each connected at one end to a single node. The opposite ends of the resistors are then individually and selectively switched between two or more terminals according the binary state of the corresponding bit of the digital input signal. When the resistors are sized by $R_k = R_T/w_k$ for some chosen value of $R_T$, and the resistors connected to a voltage $V_R$ or 0 for $d_k = 1$ or 0 respectively, the circuit behaves as a constant resistance $$\left( R_T \bigg/ \sum_{k=0}^{n-1} w_k \right)$$

to a voltage in accordance with Equation (1), where $R = V_R$.

An application of a four-element voltage-switched resistor DAC is shown as circuit 100 in FIG. 1. Resistors 102-105 and switches 132-135 comprise the network described above. Operational amplifier 145 and feedback resistor 140 provide a buffered output voltage in accordance with Equation 1, with $$R = -V_R \frac{R_F}{R_T} \sum_{k=0}^{n-1} w_k.$$

A charge-scaling DAC, an example of which is shown in FIG. 2 includes a collection of accuracy-determining capacitors connected at one end to a single node. The opposite ends of the capacitors are then individually switched between two or more terminals on the basis of a digital input signal. An additional switch is required to define the initial condition of the capacitors by setting the voltage at the node. When the capacitors are sized by $C_k = C_T w_k$, the circuit behaves as a constant capacitance $$\left( C_T \sum_{k=0}^{n-1} w_k \right)$$

to a voltage in accordance with Equation (1), determined by the initial conditions and the voltages present at the terminals.

An application of a four-element charge-scaling DAC is shown as circuit 200 in FIG. 2. Capacitors 202-205 and switches 232-235 are the network above, with switch 230 providing the initial conditions. Transconductance amplifier 245 and feedback capacitance 240 provide a buffered output at $v_{OUT}$ in accordance with Equation 1. Specifically, if switch 230 was most recently closed with $V_R = V_{R0}$ and $d_k = e_k$, then when switch 230 is opened, $$v_{out} = \frac{C_T \sum_{k=0}^{n-1} w_k}{C_F} \left( V_{R0} \sum_{k=0}^{n-1} e_k w_k - V_R \sum_{k=0}^{n-1} d_k w_k \right).$$

The implied subtraction function is useful in constructing successive-approximation ADCs using the DAC network to additionally provide the required sample-and-hold and residue-subtraction functions. A description of a charge-scaling DAC used in a successive-approximation ADC is provided in J. L. McCreary and P. R. Gray, "All-MOS Charge Redistribution Analog-to-Digital Conversion Techniques—Part I," IEEE J. Solid-State Circuits, vol. SC-10, pp. 371-379, December 1975, and incorporated herein by reference.

The two voltage-switched DAC architectures described above have differing performance characteristics. Specifically, the architectures described both include accuracy-determining elements and accuracy-degrading elements. The accuracy-determining elements are those which are intentionally inserted into the DAC and whose values are chosen to give the desired weights and accuracy. In the case of the voltage-switched resistor DAC, this corresponds to the resistors, and in the charge-scaling DAC to the capacitors.

Added to these elements are a number of accuracy-degrading elements and other factors. For the voltage-switched resistor DAC, for example, the on-state resistance of the switches, the parasitic resistance of interconnect wiring, and the non-zero impedance provided by the source of the reference all degrade the accuracy that would be attainable with the resistors alone. For the charge-scaling DAC, parasitic interconnect capacitances degrade the accuracy. Additional degradation occurs due to self-heating effects in the resistors of the voltage-switched resistor DAC and leakage currents of the capacitors of the charge-scaling DAC.

The settling speed of the two approaches depends greatly on the implementation details. The voltage-switched resistor DAC's settling behavior is determined primarily by the parallel impedance of the resistors and the parasitic capacitance of the output. The charge-scaling DAC's behavior, on the other hand, is determined by the parasitic parallel impedance of the switches and interconnect and the total parallel capacitance.

Ignoring the noise of the required references and biases, the noise of the voltage-switched resistor DAC is determined by the value of the parallel resistance, so both speed and noise may be improved by lowering $R_T$, at the cost of exacerbating the impact of the accuracy-degrading factors described above, and drawing additional power.

The charge-scaling DAC's noise, on the other hand, is determined by the $\sqrt{kT/C_T}$ noise sampled at the end of the reset phase, so better noise and accuracy comes at the cost of slower settling and increased power.

The reference current draw of the voltage-switched resistor DAC has a low frequency component which varies non-linearly with the output and thereby degrades the system accuracy. On the other hand, the charge-scaling DAC has high inrush currents when it is switched, also causing an accuracy-degrading disturbance to the system.

Thus, there are drawbacks to both voltage-switched and charge-scaling DAC architectures as described above. It is therefore desirable to produce a new DAC structure which allows less constrained optimization of the performance.

SUMMARY OF THE DISCLOSURE

In accordance with one aspect of the disclosure embodiments, a circuit includes digital-to-analog converter configured to produce an analog output signal (1) proportional to a reference signal and (2) as a function of a digital input signal. The converter comprises a plurality of non-trivially complex admittances configured so that each non-trivially complex admittance can be selectively switched as a function of the digital input signal so as to be coupled between a reference terminal configured to receive a reference signal and an output terminal.

In accordance with another aspect of the disclosed embodiments, a method of converting a digital signal to an analog signal comprises selectively switching non-trivially complex admittances as a function of the digital signal between a reference terminal and an output terminal.

Finally, in accordance with another aspect, of the disclosed embodiment, a circuit includes a digital-to-analog converter configured to produce an analog output signal (1) proportional to a reference signal and (2) as a function of a digital input signal. The converter comprises: at least one reference terminal configured to receive the reference signal; an output terminal configured to provide the analog output signal as a function of the digital input signal; a plurality of non-trivially complex admittances; and a plurality of switches responsive to the digital input signal and configured to selectively couple the non-trivially complex admittances between the reference terminal or terminals and the output terminal.

GENERAL DESCRIPTION OF THE DRAWINGS

FIGS. 5A-5E are schematics of five additional embodiments of different types of admittance elements that can be used in a non-trivially-complex admittance DAC in accordance with the principles disclosed herein.

DETAILED DESCRIPTION OF THE DRAWINGS

Figure 1:
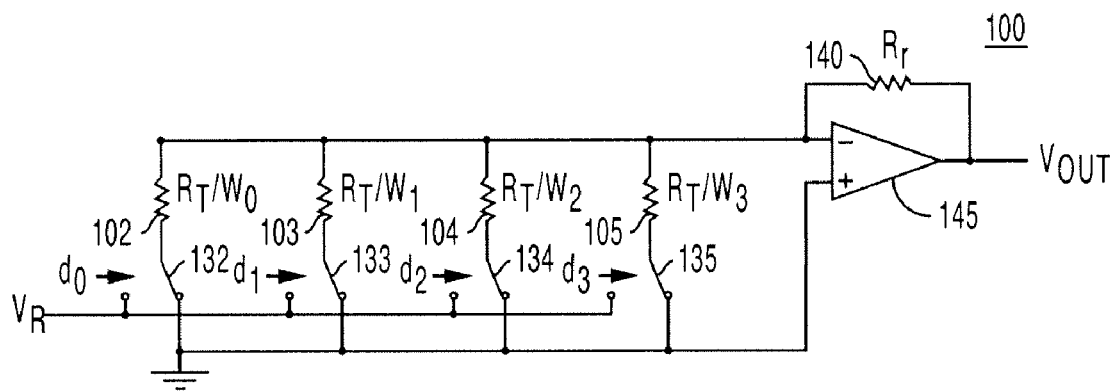
FIG. 1 is a schematic of a prior art application of a voltage-switched resistor DAC.
Figure 2:
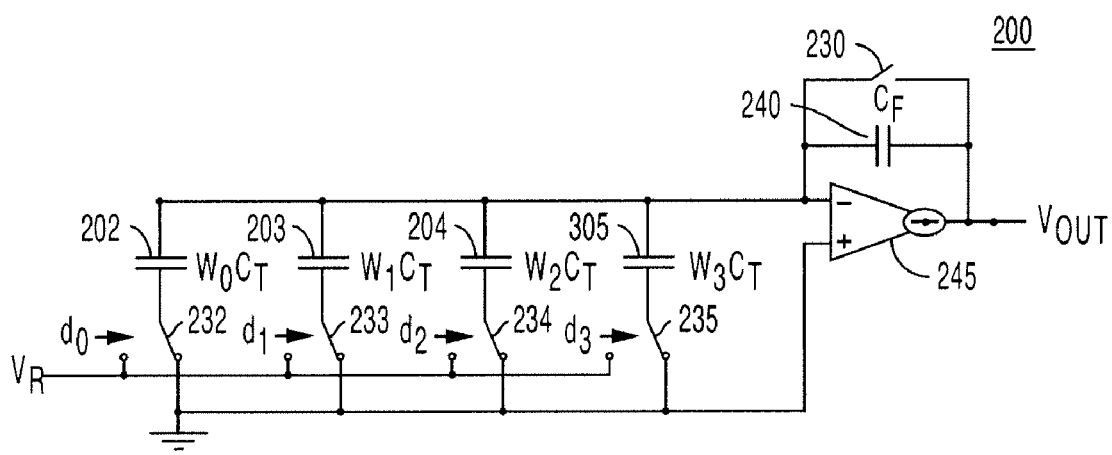
FIG. 2 is a schematic of a prior art application of a charge scaling DAC.
Figure 3:
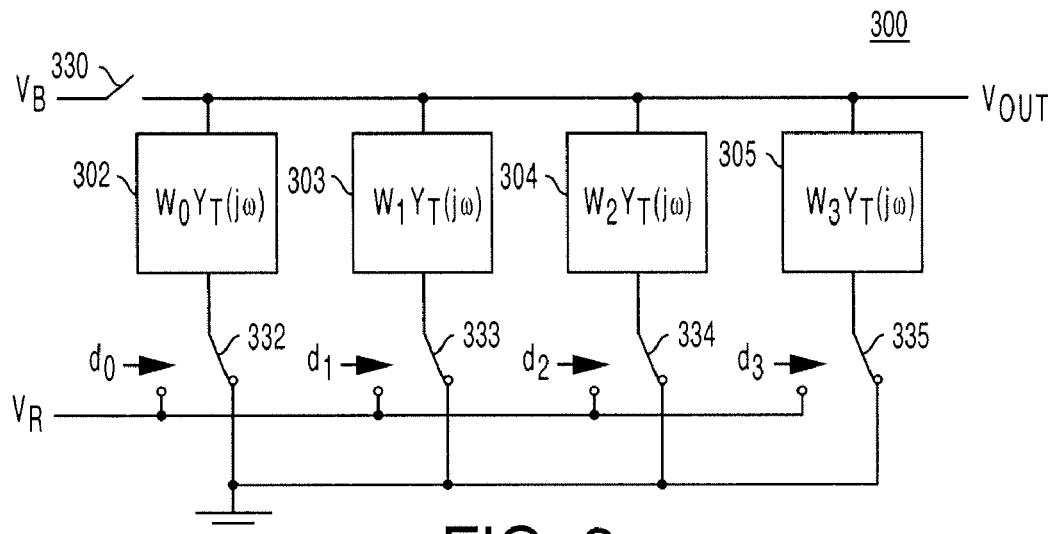
FIG. 3 is a schematic of a portion of a one embodiment of a complex-admittance DAC in accordance with the principles disclosed herein.

In order to address the above-noted drawbacks of voltage-switched and charge-scaling DAC architectures, a voltage-switched DAC can be designed that includes scalar-weighted complex admittances as its accuracy-determining elements to give performance superior to the voltage-switched resistor DAC or charge-scaling DAC in several regards. An example of a four-element embodiment is shown as circuit 300 in FIG. 3 as an illustration. Each box contains a non-trivially complex admittance: a network of one or more elements which presents an admittance between its terminals which is neither purely real nor purely imaginary. Moreover, the non-trivially complex admittances are the intentional accuracy-determining elements of the DAC.

The admittances are scaled from a master admittance $Y_T$ by the bit-weights $w_k$. For the ith resistor, capacitor, or inductor contained in admittance k, the following can be expressed:

$$R_{k,i} = \frac{R_{T,i}}{w_k}$$

$$C_{k,i} = w_k C_{T,i}$$

$$L_{k,i} = \frac{L_{T,i}}{w_k}$$

Switch 330 is used to set the initial conditions of the admittances in the cases wherein $Y_T$ has zero DC admittance. It is unnecessary for embodiments with non-zero DC admittance.

Figure 4:
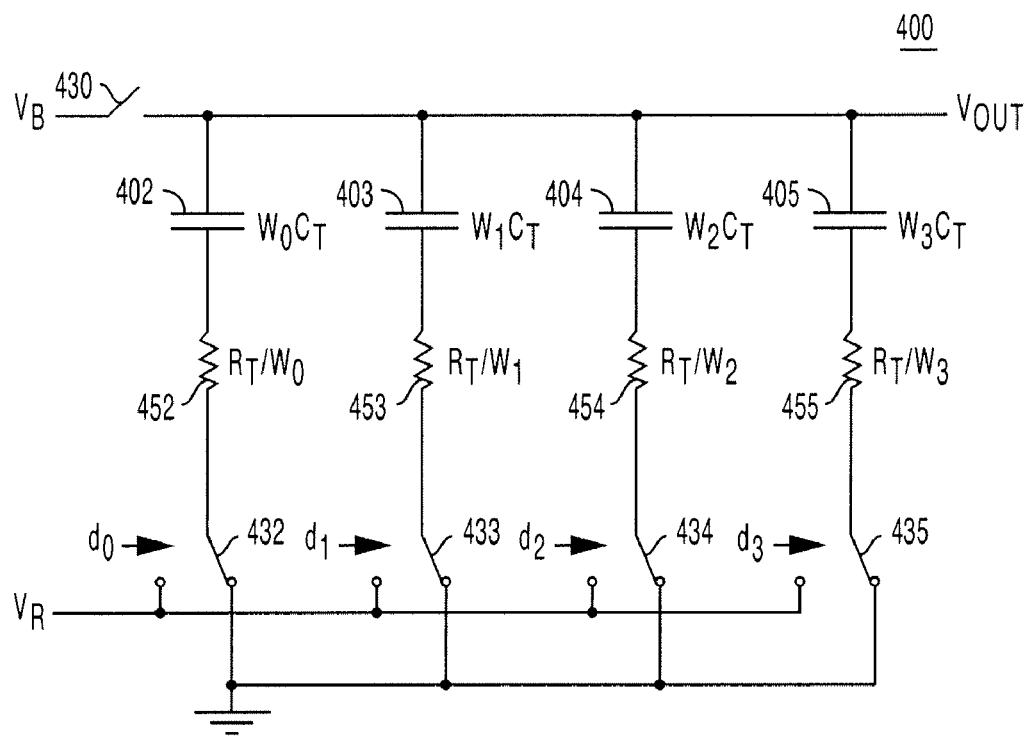
FIG. 4 is a schematic of a portion of one embodiment of a complex-admittance DAC using a series resistor-capacitor for each non-trivially complex admittance element.

These principles are shown in the embodiment of circuit 400 in FIG. 4. In circuit 400 the master admittance $Y_T$ is a resistor and capacitor connected in series. Scaling from the master admittance is accomplished by multiplying the individual resistor and capacitor admittances by the bit weights—that is to say the capacitor values are multiplied by the bit weights, and the resistor values divided by them.

In operation, circuit 400 behaves similarly to the charge-scaling DAC 200. It must be used in a sampled fashion because the DC value of the admittance driving $v_{OUT}$ is zero. During a reset phase, switch 430 is closed, and switches 432-435 are set to a known state, charging capacitors 402-405 based on that state and $V_B$. Switch 430 is then opened, and switches 432-435 are controlled by the digital input signal d. This causes $v_{OUT}$ to change by an amount determined by the references and the digital word, obeying Equation (1) just as circuit 200 does.

This configuration has performance advantages compared to both the charge scaling DAC and the resistor DAC. The final accuracy is dependent only on the capacitor matching. Furthermore, the accuracy degradations associated with current draw are also reduced. Also in common with the charge-scaling DAC, signal functions, sampling, and arithmetic may be conducted using the charge-storage of the capacitors. The fast transient behavior is determined by the resistor, thus the peak current drawn during transition is limited by the resistor.

Settling to the accuracy of the resistor matching happens at the same speed as an equivalent-valued resistor DAC, and it is possible to make this faster than the settling of an equivalent-valued charge-scaling DAC. Moreover, because the final accuracy is determined by the capacitors, the resistor values may be made smaller without incurring final accuracy penalties due to the size of the resistors.

Examples of some alternative embodiments of the non-trivially complex admittances are shown in FIGS. 5A-5E. An admittance constructed of a resistor 802 and a capacitor 805 in parallel, as shown in FIG. 5A, allows selection of a large resistor, which is desirable for accuracy, power, and reference current reasons (as described above) without paying the noise or speed penalties associated with the large value. As in a resistor DAC the output accuracy continues to be good indefinitely, even in the presence of small leakages.

Using an inductor 815 and resistor 812 in series as the admittance as shown in FIG. 5B produces a DAC which has no appreciable high-frequency reference current draw. Whereas a resistor DAC has sharp steps in its current waveform at switching instants, the series L-R combination has an exponential change between levels.

The R-L-C admittance of the FIG. 5C embodiment includes resistor 825 connected in parallel with inductor 827, and both in series with capacitor 822. This arrangement lowers the noise of a series R-C admittance by shorting the broadband resistor noise at high frequency, and speeds its transition to capacitor-based accuracy by making the settling behavior that of a second-order system.

The embodiment of the admittance network of illustrated in FIG. 5D is a combination of the networks of FIG. 5A and circuit 400 of FIG. 4. The capacitor 835 is in series with the resistor 837, with both connected in parallel with the resistor 832. This arrangement gives the settling and current-draw characteristics of a series R-C, with bounded long-term accuracy loss, and gives the benefits of the parallel R-C network of FIG. 5A without the very high transition currents that the simple parallel network would have.

The embodiment of the network of FIG. 5E is a combination of the embodiments of FIGS. 5A and 5C, wherein resistor 842 is connected in parallel with capacitor 845, the combination connected in series with the parallel connection of inductor 847 and resistor 849. This arrangement offers the desirable settling and noise characteristics of the R-L-C admittance, while also maintaining a bounded long-term accuracy loss. It should be evident that many other admittance networks can be derived providing distinct advantages which may be suited for certain applications.

Returning to circuit 400 of FIG. 4, an improvement may also be realized by including the on-state admittance of the switches in the series conductance (e.g. sizing the switches to have weighted admittances as well). Such an arrangement provides a greater benefit in the context of circuit 400 due to the explicitly included conductance in the admittance network, which reduces the effect of non-linearity of the switches.

The finite output admittance of the circuit supplying the reference voltage degrades the accuracy of the resistor settling. Thus, a further accuracy improvement may be realized by controlling that reference circuit such that its output admittance may be included in the series conductance of the complex admittance. Two possible methods of accomplishing this are to adjust the reference output admittance on the basis of which complex admittances are connected to it, or to provide a separate reference terminal to each admittance, each reference having an output admittance scaled by the bit weight of the non-trivially complex admittance to which it will be connected.

The aggregate settling behavior can be made very fast to a moderate accuracy, with full capacitor accuracy resulting after sufficient $R_T C_T$ time constants. This behavior is particularly desirable in a successive-approximation ADC with error correction (that is, a converter built with at least one bit—a "correction bit"—which is larger than its appropriate binary weight, which can compensate for transitory errors in the early decision process of a size appreciably larger than the overall converter resolution). In such a configuration, the initial bit decisions may be made very quickly on the basis of the moderate-accuracy result, while the final accurate decisions are based on the high-accuracy result.

Figure 6:
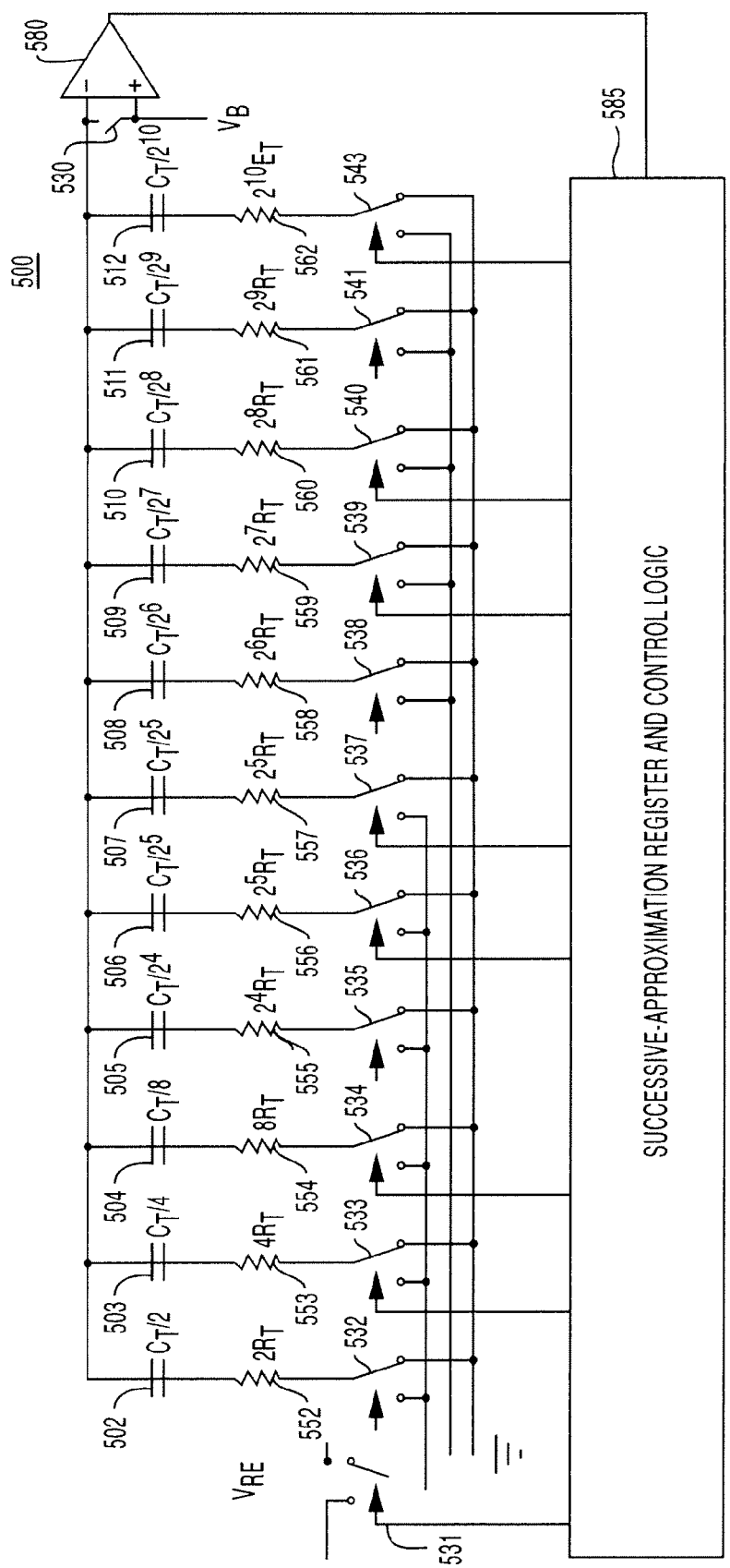
FIG. 6 is a schematic of a 10-bit successive approximation analog-to-digital converter (ADC) embodiment including a non-trivially-complex admittance DAC.

An embodiment of this technique is shown as circuit 500 in FIG. 6. Circuit 500 comprises a DAC built in accordance with the principles of this invention (capacitors 502-512, resistors 552-562, and switches 530, 532-542), plus switch 531 which both samples the input signal and provides the initial conditions for the admittances, and comparator 580 and successive-approximation control logic 585, which operate the DAC in feedback to accomplish an analog-to-digital conversion function.

The operation of the circuit proceeds in similar fashion to standard charge-redistribution ADCs. However, since the DAC is built with an error correction bit-the extra $C_T/32$ leg of elements 507, 537 and 557—it may make good use of the characteristics of the admittance DAC. The correction bit allows the higher order bits (502-506, 532-536, and 552-556), to be decided on the basis of the fast, less accurate resistor settling instead of the slower high-accuracy capacitor settling, and the lower order bits to be decided on the basis of the accurate, slower capacitor settling, improving the accuracy/speed tradeoff that would otherwise be required with a voltage-switched resistor DAC or a charge-scaling DAC. Additionally, the inclusion of the resistors may dramatically reduce the peak currents flowing and drawn from $V_{REF}$, which will improve overall system performance.

Figure 7:
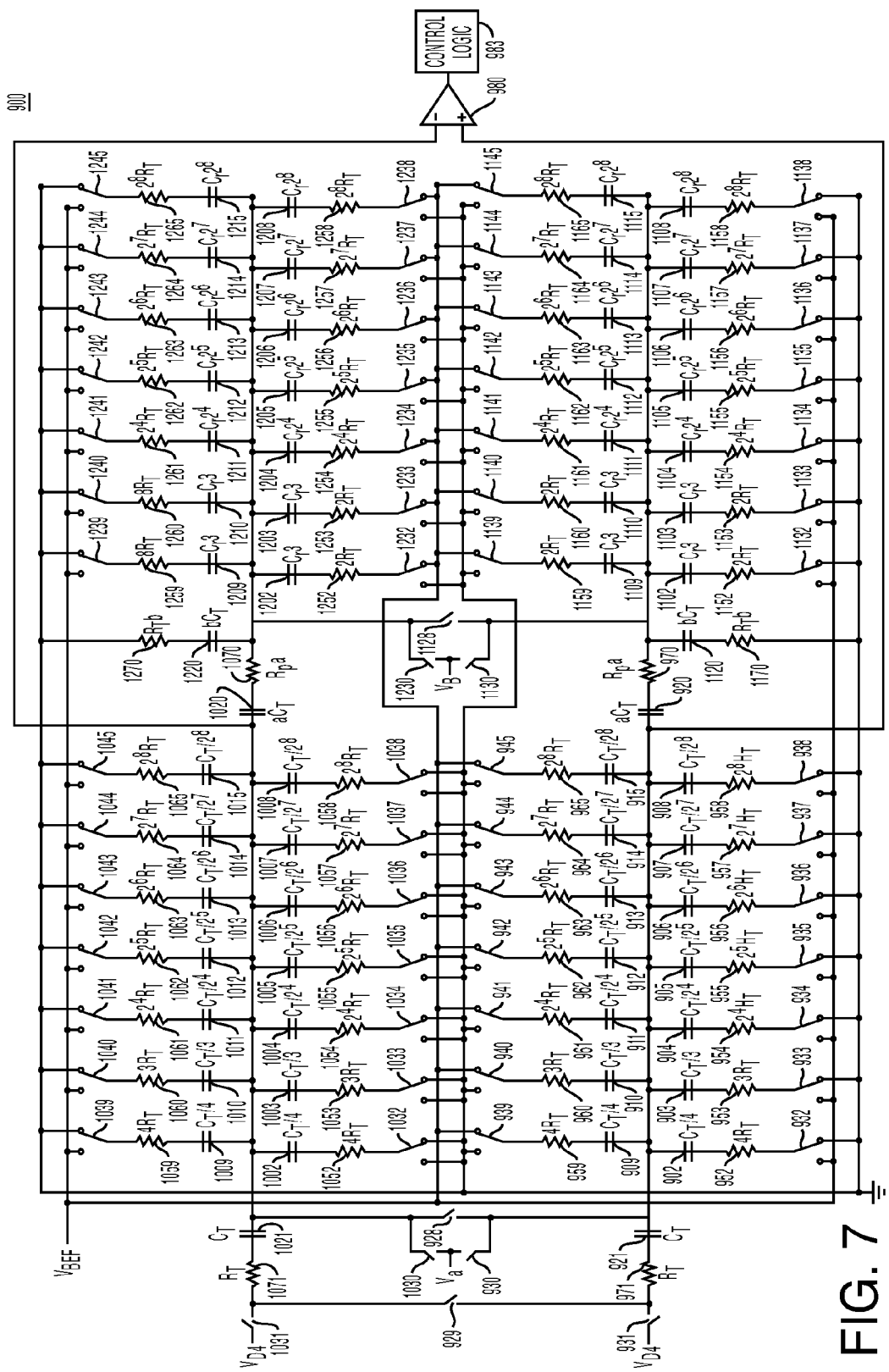
FIG. 7 is a schematic of a 14-bit successive approximation ADC employing a non-trivially-complex admittance DAC with additional improvements.

A further embodiment incorporating additional improvements is illustrated in the example of a 14-bit successive-approximation converter shown as circuit 900 in FIG. 7. Circuit 900 contains four admittance DACs (comprised of components 902-915, 932-945, 952-965; of 1002-1015, 1032-1045, 1052-1065; of 1102-1115, 1132-1145, 1152-1165; and of 1202-1215, 1232-1245, 1252-1265) which are operated together to perform the digital-to-analog function. It additionally contains capacitors 920, 1020, and resistors 970, 1070, which serve to couple pairs of DACs, capacitors 921, 1021, resistors 971, 1071 and switches 929, 931, 1031, which serve to sample the input voltage, and comparator 980 and control logic 985 which control the action of the switches (connections not shown) to operate the DAC in feedback to accomplish an analog-to-digital conversion function.

Circuit 900 is built to operate in a fully-differential fashion to provide for improved signal-to-noise ratio and rejection of common-mode disturbances. Circuit construction is completely symmetric, element 902 matching 1002, 921 matching 1021, 1102 matching 1202, and so on. In operation, matching switches function complementarily. That is to say that if 932 is connected to ground, 1032 is connected to $V_{REF}$, and vice-versa. As is typical of differential circuits, this operation improves the noise and accuracy performance of the circuit.

Circuit 900 also employs a compound DAC structure related to that used in other voltage switched DACs to obtain a very wide range of bit weights without requiring an equivalently large range of well matched admittances. The general technique used is to add one or more coupling admittances (920, 970 and 1020, 1070 in this case) whose opposite ends are driven, not by the reference, but by a voltage which is a controllable fraction of the reference, as determined by the digital code input. In circuit 900, this is accomplished with the secondary DACs 1102-1115, 1132-1145, 1152-1165 and 1202-1215, 1232-1245 and 1252-1265, which are operated as if they were smaller capacitors connected to the main DAC outputs. Termination elements 1120, 1170 and 1220, 1270 are sized (in accordance with the sizing of 920, 970 and 1020, 1070) to obtain the desired scaling of the voltage effect on the main DAC outputs.

Using the separate admittances 921, 971 and 1021, 1071 in conjunction with switches 929, 931, 1031 to sample the input provides independence from the input common mode, as it typically does in comparable charge-redistribution successive-approximation ADCs. With the switching scheme shown, the common mode of the input signal is substantially eliminated from the operation of the DACs themselves and the comparator 980. Since these admittances are also connected to the DAC outputs, they are also constructed as multiples of the master admittance, that multiple controlling the conversion range of the input with respect to $V_{REF}$.

Setting of the initial conditions of the DACs is accomplished with switches 928, 930, 1030, 1128, 1130, and 1230, which are turned on while the input is being sampled. Switches 928, 930, and 1030 then serve the additional function of sampling the input signal.

Figure 8:
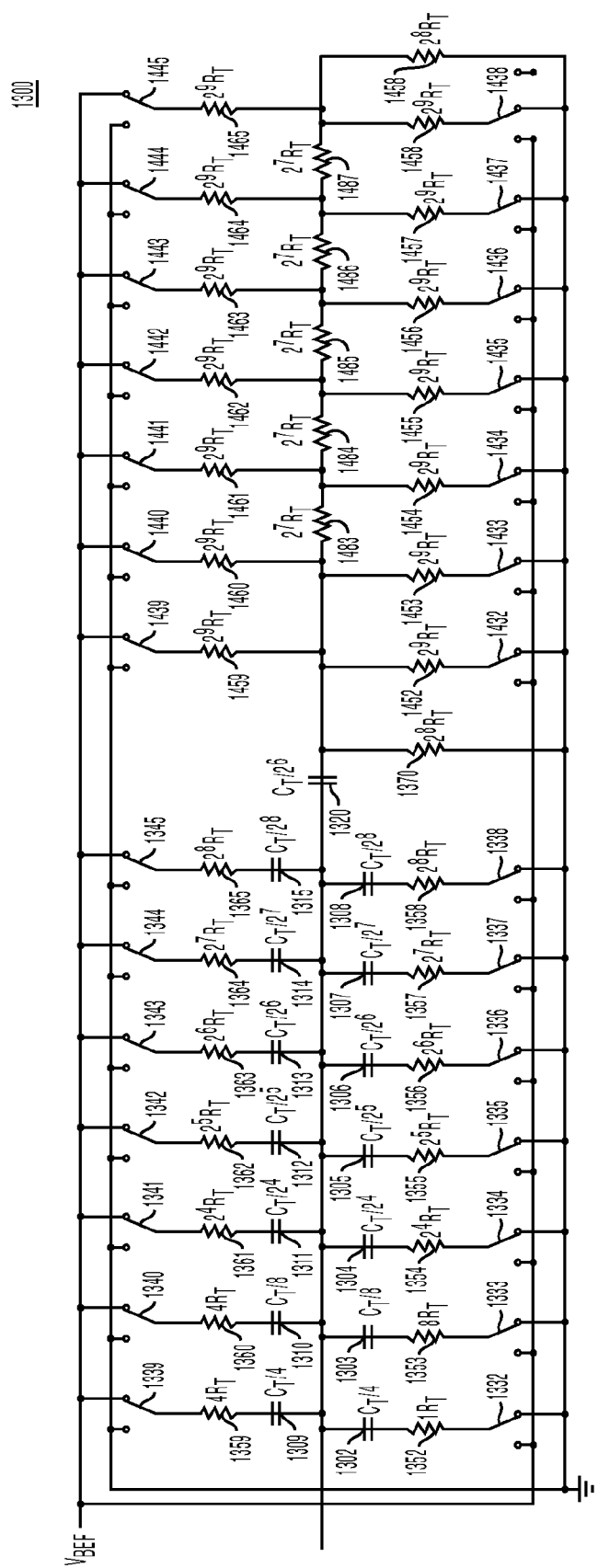
FIG. 8 is a schematic of an alternative compound non-trivially-complex admittance DAC.

Circuit 1300 in FIG. 8 demonstrates an example of an alternative embodiment of the compound DAC structure employing some of the improvements described herein. Circuit 1300 shows only the DAC portion of one side of the replacement. A duplicate copy and appropriate additional hardware would be required to attain the functionality of circuit 900. Circuit 1300 creates a coupling admittance which is partially physically present in the circuit (the capacitor 1320) and partly present by equivalence: the resistor network composed of elements 1370, 1452-1465, 1470, and 1483-1487 has a combined output resistance of $2^6 R_T$, which forms the resistive portion of the admittance. This alternate embodiment eliminates the requirement of setting initial conditions for the secondary DAC.

Returning to circuit 900, each DAC is built with a split bit weight structure: for each weight $w_k$ that would occur in a typical implementation, that weight instead corresponds to two non-trivially complex admittances each with half the weight, which are then controlled in concert. For example, instead of the largest weighted capacitor in each of the differential DACs being $C_T/2$, there are instead two capacitors having size $C_T/4$ (902, 909 and 1002, 1009). This weighting scheme is particularly advantageous to the successive approximation use of the DAC, a technique which has been described in conjunction with charge-scaling DACs. See for example, B. P. Ginsburg and A. P. Chandrakasan, "An Energy-Efficient Charge Recycling Approach for a SAR Converter with Capacitive DAC," IEEE Symp. Circuits & Systems, vol. 1, pp. 184-187, March 2005. As an example of its operation, in an initial reset state, switches 928, 930, 931, 1030, 1031 are closed, sampling the input voltage on capacitors 921, 1021. In this state, the switches of all of the DACs are in the state shown. That is to say, switches 932-938, 1039-1045, 1132-1138, 1239-1245 are connected to ground while 939-945, 1032-1038, 1139-1145, 1232-1238 are connected to $V_{REF}$. The converter then transitions to performing a conversion by opening switches 928, 930, 1030, then 931, 1031, then closing switch 929. After each bit is tested by the comparator, exactly one pair of DAC switches transitions to prepare for the next bit test. For example, depending on the result of the first bit test, either switches 932, 1032 are switched, or switches 939, 1039 are. In contrast, in circuit 700, after the first bit test, switch 733 is switched, and 732 is either switched or not depending on the result of the bit test. The operation of circuit 900 causes less system disturbance and draws equal or less charge from the reference. Moreover, the disturbance is also much less dependent on the input voltage being converted. Furthermore, each switch needs only transition in a single direction during the conversion process, which means that it and the logic path which controls it may be optimized for speed in a single direction, speeding the conversion process.

It should be apparent from the foregoing that a voltage-switched DAC can be designed that includes scalar-weighted non-trivially-complex admittances as its accuracy-determining elements to give performance superior to the voltage-switched resistor DAC or charge-scaling DAC architectures.

While this disclosure has been particularly shown and described with references to preferred embodiments thereof, it will be understood by those skilled in the art that various changes in form and details may be made therein without departing from the spirit and scope of the disclosure as defined by the following claims.

What is claimed is:

1. A circuit including a digital-to-analog converter configured to produce an analog output signal (1) proportional to a reference voltage signal and (2) as a function of a digital input signal, said converter comprising:
    at least one reference terminal configured to receive the reference voltage signal;
    an output terminal configured to provide the analog output signal as a function of the digital input signal;
    a plurality of non-trivially complex admittances, each of a known and finite value; and
    a plurality of switches responsive to the digital input signal and configured to selectively couple the non-trivially complex admittances between the reference terminal or terminals and the output terminal.

2. The circuit of claim 1, wherein the non-trivially complex admittances are substantially scalar multiples of a master admittance.

3. The circuit of claim 2, wherein the on-state admittances of the switches are scaled by similar multiples as those of the corresponding non-trivially complex admittances, so as to reduce or eliminate the accuracy degradation due to the admittance of each switch.

4. The circuit of claim 2, further including at least one reference circuit coupled and presenting an admittance to the reference terminal, the admittance of the reference circuit being such that when coupled to the non-trivially complex admittances the accuracy degradation due to the admittance of the reference circuit is reduced or eliminated.

5. The circuit of claim 4, further including a plurality of reference terminals, wherein the admittance presented at each reference terminal is such that when coupled to a non-trivially complex admittance the accuracy degradation due to the input admittance provided each reference terminal is reduced or eliminated.

6. The circuit of claim 1, wherein the circuit comprises an analog-to-digital converter, the analog-to-digital converter including the digital-to-analog converter.

7. The circuit of claim 6, wherein an admittance separate from the digital to analog converter is used to sample the input signal.

8. The circuit of claim 6, wherein the analog-to-digital converter is configured to provide analog-to-digital conversion at least partially by successive approximation.

9. The circuit of claim 8, wherein the analog-to-digital converter is configured to provide error correction as a part of successive approximation.

10. The circuit of claim 8, wherein the plurality of non-trivially complex admittances have a split bit weight structure.

11. The circuit of claim 1, wherein the circuit includes a differential circuit including a second digital-to-analog converter having a second output terminal, the second digital-to-analog converter producing an output signal at the second output terminal also representative of the same digital input signal, wherein the two output terminals provide a substantially differential output signal.

12. The circuit of claim 1, further including a second digital-to-analog converter configured to operate with the first mentioned digital-to-analog converter as a compound digital to analog converter, said second digital-to-analog converter comprising:
an output terminal coupled to the output terminal of the first mentioned digital-to-analog converter for providing an output analog signal indicative of a second digital input signal.

13. A circuit including a digital-to-analog converter configured to produce an analog output signal (1) proportional to a reference voltage signal and (2) as a function of a digital input signal, said converter comprising:
a plurality of non-trivially complex admittances, each of a known and finite value, and configured so that each non-trivially complex admittance can be selectively switched as a function of the digital input signal so as to be coupled between a reference terminal configured to receive a reference voltage signal and an output terminal.

14. The circuit of claim 13, wherein the non-trivially complex admittances are substantially scalar multiples of a master admittance.

15. The circuit of claim 13, wherein the circuit comprises an analog-to-digital converter, the analog-to-digital converter including the digital-to-analog converter.

16. The circuit of claim 15, wherein an admittance separate from the digital to analog converter is used to sample the input signal.

17. The circuit of claim 15, wherein the analog-to-digital converter is configured to provide analog-to-digital conversion at least partially by successive approximation.

18. The circuit of claim 17, wherein the analog-to-digital converter is configured to provide error correction as a part of successive approximation.

19. The circuit of claim 13, wherein each non-trivially complex admittance includes at least one resistor and at least one susceptance element.

20. The circuit of claim 19, wherein the at least one susceptance element is a capacitor.

21. The circuit of claim 19, wherein the at least one susceptance element is an inductor.

22. A method of converting a digital signal to an analog signal, the method comprising:
selectively switching non-trivially complex admittances, each of a known and finite value, as a function of the digital signal between a reference voltage terminal and an output terminal.

23. A method according to claim 22, wherein selectively switching each of a plurality of non-trivially complex admittance values includes selectively switching non-trivially complex admittances in a predetermined sequence.

24. A method according to claim 23, wherein the digital signal includes a plurality of binary bits capable of being presented as either a binary state one or binary state zero, and the values of the non-trivial complex admittances vary so as to correspond to all of the potential binary values of the bits of digital signal, and wherein selectively switching non-trivially complex admittances includes selectively switching only those non-trivial complex admittances corresponding to those bits that presented as a binary state of one.

25. A method of converting a digital input signal to an analog output signal, the method comprising
receiving at least one reference voltage signal at a corresponding reference terminal;
providing the analog output signal at an output terminal as a function of the digital input signal;
controlling a plurality of switches responsively to the digital input signal so as to selectively couple non-trivially complex admittances, each of a known and finite value, between the reference terminal or terminals and the output terminal so that the analog output signal is (1) proportional to a reference voltage signal and (2) a function of a digital input signal.

26. The method of claim 25, further including arranging the non-trivially complex admittances so that they are substantially scalar multiples of a master admittance.

27. The method of claim 26, further including arranging the on-state admittances of the switches so that they are scaled by similar multiples as those of the corresponding non-trivially complex admittances, so as to reduce or eliminate the accuracy degradation due to the admittance of each switch.

28. The method of claim 26, further presenting an admittance of a reference circuit to the reference terminal such that when coupled to the non-trivially complex admittances the accuracy degradation due to the admittance of the reference circuit is reduced or eliminated.

29. The method of claim 28, further including coupling the admittances to a plurality of reference terminals so that the admittance presented at each reference terminal is such that when coupled to a non-trivially complex admittance the accuracy degradation due to the input admittance provided each reference terminal is reduced or eliminated.

30. The method of claim 25, wherein converting a digital input signal to an analog output signal is performed within an analog-to-digital converter.

31. The method of claim 30, wherein an admittance separate from the non-trivially complex admittances is used to sample the input signal.

32. The method of claim 30, further including converting an analog signal to a digital signal within the analog to digital converter at least partially in accordance with successive approximation.

33. The method of claim 32, further including providing error correction as a part of successive approximation.

34. The method of claim 32, further including arranging the plurality of non-trivially complex admittances so that they have a split bit weight structure.

35. The method of claim 25, further including providing two analog output signals at two respective output terminals so as to provide a substantially differential output signal.

36. The method of claim 25, further including providing two digital-to-analog converters, at least one of the converters including non-trivially complex admittances, and configured to operate as a compound digital to analog converter.

37. A method of producing an analog output signal (1) proportional to a reference voltage signal and (2) as a function of a digital input signal, comprising:
configuring a plurality of non-trivially complex admittances, each of a known and finite value, so that each non-trivially complex admittance can be selectively switched as a function of the digital input signal so as to be coupled between a reference terminal configured to receive a reference voltage signal and an output terminal.

38. The method of claim 37, wherein configuring the non-trivially complex admittances includes configuring the non-trivially complex admittances so that they are substantially scalar multiples of a master admittance.

39. The method of claim 37, wherein producing an analog signal is performed within an analog-to-digital converter.

40. The method of claim 37, further including sampling the input signal with an admittance separate from the plurality of non-trivially complex admittances.

41. The method of claim 39, wherein configuring a plurality of non-trivially complex admittances so that each non-trivially complex admittance can be selectively switched as a function of the digital input signal so as to be coupled between a reference terminal configured to receive a reference voltage signal and an output terminal, wherein the switching is performed at least partially by successive approximation.

42. The method of claim 41, wherein switching includes error correction as a part of successive approximation.

43. The method of claim 37, further including configuring each non-trivially complex admittance so that it includes at least one resistor and at least one susceptance element.

44. The method of claim 43, further including configuring each non-trivially complex admittance so that it includes at least one resistor and at least one capacitor.

45. The method of claim 43, further including configuring each non-trivially complex admittance so that it includes at least one resistor and at least one inductor.

* * * * *